United States Patent
Su

(10) Patent No.: US 8,337,068 B1
(45) Date of Patent: Dec. 25, 2012

(54) SELECTION SYSTEM RELATING TO LIGHT-EMITTING DIODE DIES AND METHOD THEREOF

(75) Inventor: Hung-Yen Su, New Taipei (TW)

(73) Assignees: Cal-Comp Electronics & Communications Company Limited, New Taipei (TW); Kinpo Electronics, Inc., New Taipei (TW)

( * ) Notice: Subject to any disclaimer, the term of this patent is extended or adjusted under 35 U.S.C. 154(b) by 0 days.

(21) Appl. No.: 13/366,268

(22) Filed: Feb. 4, 2012

(30) Foreign Application Priority Data

Dec. 16, 2011 (TW) .............................. 100146886 A

(51) Int. Cl.
*H05B 37/02* (2006.01)
*G06F 17/30* (2006.01)

(52) U.S. Cl. ........................................ 362/612; 707/752

(58) Field of Classification Search .................. 707/725; 362/612
See application file for complete search history.

(56) References Cited

U.S. PATENT DOCUMENTS

| | | | | |
|---|---|---|---|---|
| 4,992,704 | A | * | 2/1991 | Stinson .......................... 315/312 |
| 8,063,576 | B2 | * | 11/2011 | Routledge ..................... 315/291 |
| 2008/0158887 | A1 | * | 7/2008 | Zhu et al. ...................... 362/294 |

OTHER PUBLICATIONS

Naoki Kimura, Ken Sakuma, Syunichiro Hirafune, Kenichiro Asano, Naoto Hirosaki, and Rong-Jun Xie, "Extrahigh color rendering white light-emitting diode lamps using oxynitride and nitride phosphors excited by blue light-emitting diode", IEEE Xplore Digital Library, Applied Physics Letters, Jan. 2007, pp. 1-4.*

* cited by examiner

*Primary Examiner* — Cheryl Lewis
(74) *Attorney, Agent, or Firm* — Jianq Chyun IP Office

(57) ABSTRACT

A selection system relating to light emitting diode (LED) dies and a method thereof are provided. In the invention, by sorting all of charge-in LED dies, the LED dies with a same characteristic are disposed in a corresponding LED bin code area; moreover, a collocation lookup table recording a plurality of collocation parameters corresponding to the same lamp specification is established, where each collocation parameter is corresponding to at least one LED bin code area. Accordingly, even though the LED dies corresponding to a certain predetermined lamp specification are empty or are insufficient in reserve, the invention still suggests using other reserves or non-empty LED dies with different characteristics (i.e. mix bin) through the established collocation lookup table for manufacturing an LED lamp of a certain specification.

18 Claims, 2 Drawing Sheets

SELECTION SYSTEM RELATING TO LIGHT-EMITTING DIODE DIES AND METHOD THEREOF

CROSS-REFERENCE TO RELATED APPLICATION

This application claims the priority benefit of Taiwan application serial no. 100146886, filed on Dec. 16, 2011. The entirety of the above-mentioned patent application is hereby incorporated by reference herein and made a part of this specification.

BACKGROUND OF THE INVENTION

1. Field of the Invention

The invention relates to a selection technique. Particularly, the invention relates to a selection system relating to light-emitting diode dies and a method thereof.

2. Description of Related Art

A light-emitting diode (LED) is a semiconductor device, and a material of a light-emitting chip thereof is mainly a compound of chemical elements of a III-V group, for example, GaP or GaAs, and a light-emitting principle thereof is to convert electric energy into light energy. In detail, in the LED, by applying a current to a compound semiconductor, electrons and holes are combined to release excessive energy in form of light. Since the light-emitting phenomenon of the LED is not heat light-emitting or discharge light-emitting, a service life of the LED can be more than one hundred thousand hours. Moreover, the LED has advantages of fast response speed, small size, power saving, low pollution, high reliability, and suitable for mass production, etc., it is widely used in various domains such as large-scale billboards, traffic lights, mobile phones, scanners, light sources of fax machines and LED lamps, etc.

Regarding the LED lamp, a specification thereof (for example, a color temperature) has to be complied with American national standards institute (ANSI) specifications. Therefore, in order to avoid a situation that the specification of the produced LED lamp is not complied with the ANSI specifications, most of LED lamp manufacturers generally configures a plurality of LED dies with a same characteristic (for example, the color temperature or lumen) in the same LED lamp. In this way, the specification of the fabricated/produced LED lamp can be complied with a certain specification of the ANSI specifications.

Therefore, the single LED lamp is generally limited to use the LED dies of a single color temperature or lumen. However, in case that the desired LED dies with the same characteristic are empty or are insufficient in reserve, even if the LED dies of other characteristics have sufficient reserve, the LED lamps to be produced cannot be successfully manufactured.

SUMMARY OF THE INVENTION

Accordingly, the invention is directed to a selection system relating to light-emitting diode (LED) dies and a method thereof, in which when the LED dies to be used are empty or are insufficient in reserve, it is suggested to use other reserve or non-empty LED dies with different characteristics (i.e. a mix bin method) to manufacture an LED lamp of a certain specification, so as to effectively resolve the problem motioned in the related art.

An exemplary embodiment of the invention provides a selection system including a sorting module and a collocation module. The sorting module sorts a plurality of charge-in LED dies with different characteristics to dispose the LED dies with the same characteristic in a corresponding LED bin code area, and establishes a sorting table relating to all of the charge-in LED dies. The collocation module is coupled to the sorting module, and is inbuilt with a collocation lookup table. The inbuilt collocation lookup table of the collocation module records a plurality of roots corresponding to different lamp specifications, and each of the roots has a plurality of collocation parameters corresponding to the same lamp specification, where each collocation parameter corresponds to at least one LED bin code area. The collocation module reads the sorting table to learn all of the applicable LED dies, and looks up the collocation lookup table in response to an input condition of a predetermined lamp specification, so as to obtain and provide at least one collocation parameter complied with the predetermined lamp specification.

In an exemplary embodiment of the invention, when a number of the at least one collocation parameter is plural, the collocation module is capable of: 1. selecting and providing a collocation parameter corresponding to the LED dies having a sufficient reserve; or 2. displaying and providing a reserve of the LED dies corresponding to each of the collocation parameters.

In an exemplary embodiment of the invention, when a number of the at least one collocation parameter is one, the collocation module provides the obtained single collocation parameter, and notifies a charge-in end to complement the empty or insufficient LED dies.

Another exemplary embodiment of the invention provides a selection method including following steps. A plurality of charge-in LED dies with different characteristics is sorted to dispose the LED dies with the same characteristic in a corresponding LED bin code area and accordingly establish a sorting table relating to all of the charge-in LED dies. A collocation lookup table is established, where the collocation lookup table records a plurality of roots corresponding to different lamp specifications, and each of the roots has a plurality of collocation parameters corresponding to the same lamp specification, where each collocation parameter corresponds to at least one LED bin code area. The sorting table is read to learn all of the applicable LED dies, and the collocation lookup table is looked up in response to an input condition of a predetermined lamp specification, so as to obtain and provide at least one collocation parameter complied with the predetermined lamp specification.

In an exemplary embodiment of the invention, when a number of the at least one collocation parameter is plural, the method includes 1. selecting and providing a collocation parameter corresponding to the LED dies having a sufficient reserve; or 2. displaying and providing a reserve of the LED dies corresponding to each of the collocation parameters.

In an exemplary embodiment of the invention, when a number of the at least one collocation parameter is one, the obtained single collocation parameter is provided, and a charge-in end is notified to complement the empty or insufficient LED dies.

In an exemplary embodiment of the invention, the characteristic of each of the LED dies at least includes a color temperature and a lumen. In this case, when the obtained collocation parameter only corresponds to a single LED bin code area, a lamp complied with the predetermined lamp specification includes a plurality of LED dies with the same characteristic. Conversely, when the obtained collocation parameter corresponds to a plurality of LED bin code areas, the lamp complied with the predetermined lamp specification includes a plurality of LED dies with different characteristics.

In an exemplary embodiment of the invention, the lamp specification at least includes a color temperature and a lumen, and the lamp specification corresponding to each of the collocation parameters is complied with American national standards institute (ANSI) specifications.

According to the above descriptions, by sorting all of the charge-in LED dies, the LED dies with the same characteristic are disposed in the corresponding LED bin code area, and the collocation lookup table recording a plurality of collocation parameters corresponding to a same lamp specification is established, where each collocation parameter corresponds to at least one (i.e. one or more than one) LED bin code area. Accordingly, even though the LED dies corresponding to a certain predetermined lamp specification are empty or are insufficient in reserve, in the invention, it is still suggested to use other reserves or non-empty LED dies with different characteristics (i.e. a mix bin method) through the established collocation lookup table for manufacturing an LED lamp of a certain specification, so as to effectively resolve the problem mentioned in the related art.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
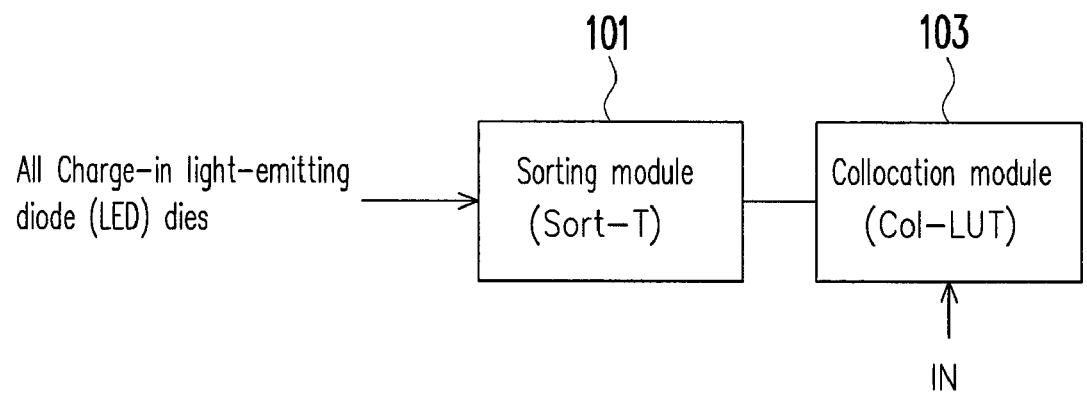
FIG. 1 is a schematic diagram of a selection system 10 relating to light-emitting diode (LED) dies according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
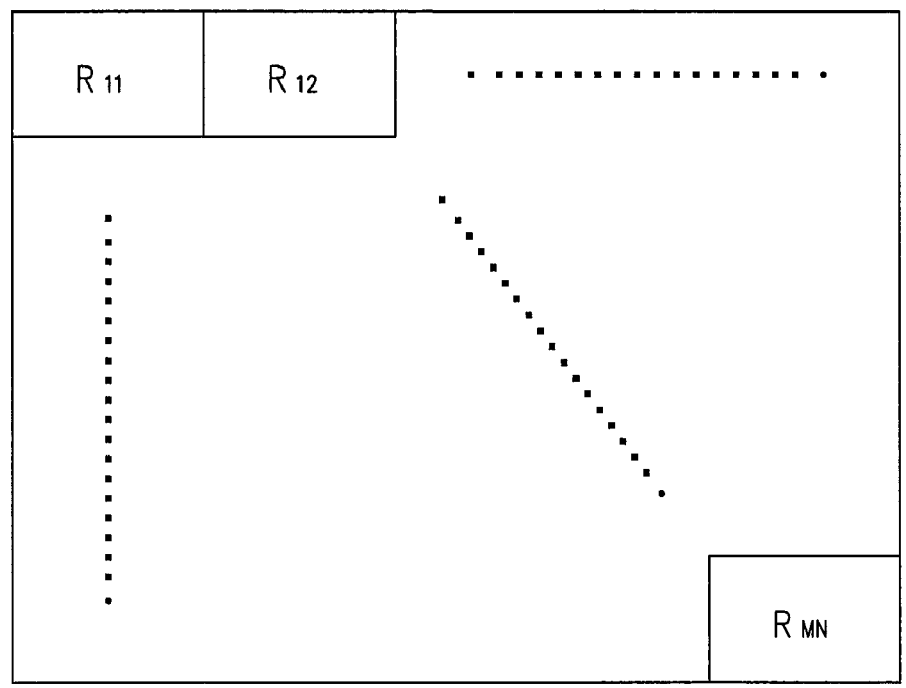
FIG. 2 is a schematic diagram of LED bin code areas of LED dies having different characteristics according to an exemplary embodiment of the invention.

FIG. 1 is a schematic diagram of a selection system 10 relating to light-emitting diode (LED) dies according to an exemplary embodiment of the invention. Referring to FIG. 1, the selection system 10 is approximately composed of two main parts, where one part is a sorting module 101, and another part is a collocation module 103. In the present exemplary embodiment, the sorting module 101 sorts a plurality of charge-in LED dies with different characteristics (for example, a color temperature and a lumen, though the invention is not limited thereto, and other characteristics such as a light-emitting wavelength and a reference voltage, etc. can also be used), so as to dispose the LED dies with the same characteristic in a corresponding LED bin code area ($R_{11}$-$R_{MN}$, as that shown in FIG. 2), and accordingly establishes a sorting table Sort-T relating to all of the charge-in LED dies.

In brief, the sorting module 101 can be a specifically designed automatic testing equipment, which can test and sort all of the charge-in LED dies, for example, test the characteristic of each of the charge-in LED dies, and dispose the LED dies with the same characteristic in the same LED bin code area $R_{11}/R_{12}/ \ldots /R_{MN}$. Obviously, the characteristics of all of the LED dies disposed in the same LED bin code area $R_{11}/R_{12}/ \ldots /R_{MN}$ are the same.

Figure 3:
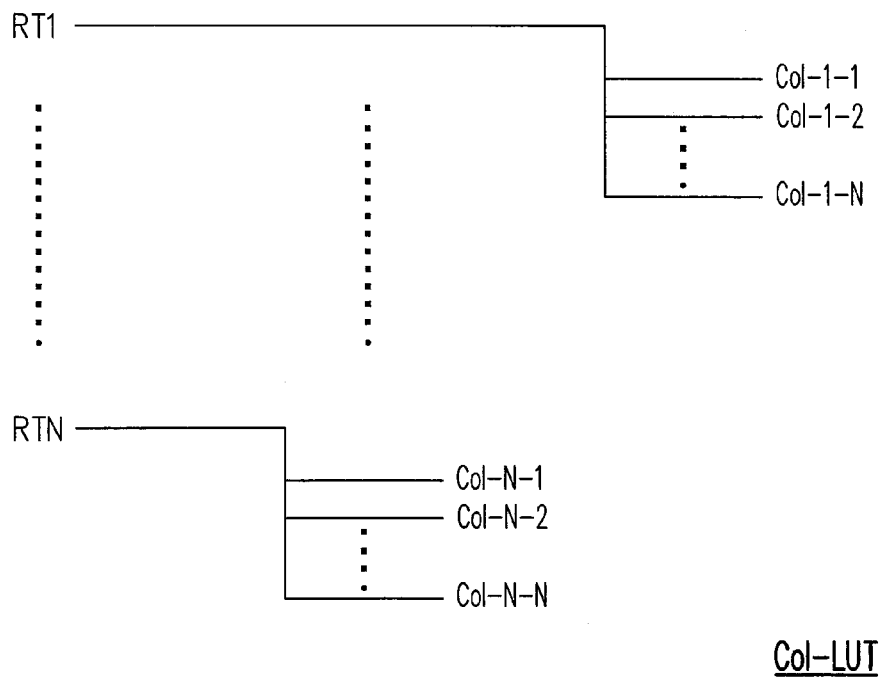
FIG. 3 is a schematic diagram of a collocation lookup table built-in a collocation module according to an exemplary embodiment of the invention.

Moreover, the collocation module 103 is coupled to the sorting module 101, and is inbuilt with a collocation lookup table Col-LUT. As shown in FIG. 3, the inbuilt collocation lookup table Col-LUT of the collocation module 103 records a plurality of roots RT1-RTN corresponding to different lamp specifications (for example, a color temperature and a lumen, though the invention is not limited thereto), and each of the roots RT1-RTN has a plurality of collocation parameters corresponding to the same lamp specification (for example, the color temperature and lumen).

For example, the root RT1 has N collocation parameters Col-1-1~Co-1-N corresponding to the same lamp specification (for example, the color temperature and lumen), and the root RT2 has N collocation parameters Col-2-1~Co-2-N corresponding to the same lamp specification (for example, the color temperature and lumen), and deduced by analogy, the root RTN has N collocation parameters Col-N-1~Co-N-N corresponding to the same lamp specification. The lamp specification corresponding to each of the collocation parameters Col-X-1~Col-X-N (X=1–N) has to be complied with American national standards institute (ANSI) specifications.

In the present exemplary embodiment, each of the collocation parameters Col-X-1~Col-X-N (X=1–N) corresponds to at least one LED bin code area $R_{11}/R_{12}/ \ldots /R_{MN}$. In other words, each of the collocation parameters Col-X-1~Col-X-N (X=1–N) can correspond to a single LED bin code area $R_{11}/R_{12}/ \ldots /R_{MN}$, or can correspond to more than one LED bin code areas $R_{11}$ and/or $R_{12}$ and/or ... and/or $R_{MN}$. All of the collocation parameters Col-X-1~Col-X-N (X=1–N) corresponding to the single LED bin code area $R_{11}/R_{12}/ \ldots /R_{MN}$ represent that the LED dies with the same characteristic are to be used to fabricate an LED lamp. Moreover, the collocation parameters Col-X-1~Col-X-N (X=1–N) corresponding to multiple LED bin code areas $R_{11}$ and/or $R_{12}$ and/or ... and/or $R_{MN}$ represent that the LED dies with different characteristics (i.e. a mix bin method) are to be used to fabricate the LED lamp.

In this way, the collocation module 103 can read the sorting table Sort-T established in the sorting module 101 to learn all of the applicable LED dies (i.e. all of the LED dies that can be used and are not empty), and looks up the inbuilt collocation lookup table Col-LUT in response to an input condition IN of a predetermined lamp specification (for example, a color temperature of 3500° K and a lumen of 1000 Lm, though the invention is not limited thereto) to find the collocation parameters Col-X-1~Col-X-N (X=1–N) complied with the predetermined lamp specification (for example, the color temperature of 3500° K and the lumen of 1000 Lm, though the invention is not limited thereto), so as to obtain and provide at least one of the collocation parameter Col-X-1~Col-X-N (X=1–N) complied with the predetermined lamp specification.

In the present exemplary embodiment, when the number of the collocation parameters obtained and provided by the collocation module 103 is plural, it represents that an amount of the LED dies disposed in each of the LED bin code areas $R_{11}$-$R_{MN}$ is sufficient. Therefore, the collocation module 103 can select and provide the collocation parameter corresponding to the LED dies with a sufficient reserve to a manufacturer of the LED lamp for reference. Alternatively, the collocation module 103 can also display and provide a reserve of the LED dies corresponding to each of the collocation parameters to the manufacturer of the LED lamp for reference/selection.

On the other hand, when the number of the collocation parameters obtained and provided by the collocation module 103 is one, it represents that an amount of the LED dies disposed in a part of the LED bin code areas $R_{11}$-$R_{MN}$ is empty or is insufficient in reserve. Therefore, the collocation module 103 provides the obtained single collocation parameter to the manufacturer of the LED lamp for reference, and notifies a charge-in end (a unit in charge of charging-in the LED dies) to complement the empty or insufficient LED dies.

It should be noticed that if each of the collocation parameters obtained and provided by the collocation module 103 corresponds to multiple LED bin code areas $R_{11}$ and/or $R_{12}$ and/or . . . and/or $R_{MN}$, the (LED) lamp complied with the predetermined lamp specification can include a plurality of the LED dies with different characteristics (the color temperature and the lumen). In other words, a plurality of the LED dies with different characteristics (i.e. the mix bin method) is used to implement the color temperature and the lumen corresponding to the predetermined lamp specification.

However, if each of the collocation parameters obtained and provided by the collocation module 103 corresponds to a single LED bin code area $R_{11}/R_{12} \ldots /R_{MN}$, the (LED) lamp complied with the predetermined lamp specification only includes a plurality of the LED dies with the same characteristic. In other words, a plurality of the LED dies with the same characteristic (the color temperature and the lumen) is used to implement the color temperature and the lumen corresponding to the predetermined lamp specification.

According to the above descriptions, in the present exemplary embodiment, the sorting module 101 is used to sort all of the charge-in LED dies to dispose the LED dies with the same characteristic in the corresponding LED bin code areas $R_{11}$-$R_{MN}$, and establishes the collocation lookup table Col-LUT recording a plurality of collocation parameters Col-X-1~Col-X-N (X=1~N) corresponding to a same lamp specification, where each collocation parameter Col-X-1~Col-X-N (X=1~N) corresponds to at least one (i.e. one or more than one) LED bin code area $R_{11}/R_{12}/\ldots /R_{MN}$. Accordingly, even though the LED dies corresponding to a certain predetermined lamp specification are empty or are insufficient in reserve, according to the present exemplary embodiment, it is still suggested to use other reserves or non-empty LED dies with different characteristics (i.e. the mix bin method) through the established collocation lookup table for manufacturing an LED lamp of a certain specification.

Figure 4:
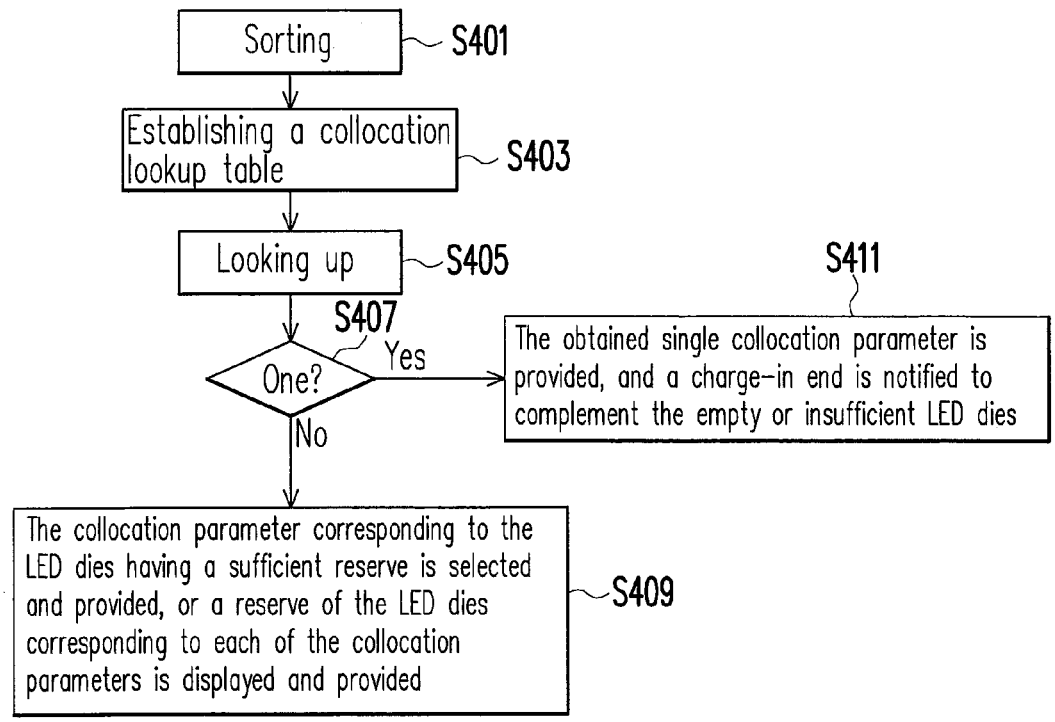
FIG. 4 is a flowchart illustrating a selection method relating to LED dies according to an exemplary embodiment of the invention.

On the other hand, based on the content disclosed/instructed by the aforementioned exemplary embodiment, FIG. 4 is a flowchart illustrating a selection method relating to LED dies according to an exemplary embodiment of the invention. Referring to FIG. 4, the selection method relating to LED dies of the present exemplary embodiment includes following steps.

A plurality of charge-in LED dies with different characteristics (for example, the color temperature and the lumen, though the invention is not limited thereto) is sorted (step S401) to dispose the LED dies with the same characteristic in a corresponding LED bin code area and accordingly establish a sorting table relating to all of the charge-in LED dies.

A collocation lookup table is established (step S403), where the established collocation lookup table records a plurality of roots corresponding to different lamp specifications, and each of the roots has a plurality of collocation parameters corresponding to the same lamp specification, where each collocation parameter corresponds to at least one LED bin code area, and the lamp specification corresponding to each of the collocation parameters is complied with the ANSI specifications.

The sorting table is read to learn all of the applicable LED dies, and the collocation lookup table is looked up in response to an input condition of a predetermined lamp specification (for example, the color temperature and the lumen, though the invention is not limited thereto), so as to obtain and provide at least one collocation parameter complied with the predetermined lamp specification.

It is determined the number of the obtained and provided collocation parameters (step S407).

When the number of the obtained and provided collocation parameters is plural (i.e. a determination result of the step S407 is "negative"), the collocation parameter corresponding to the LED dies having a sufficient reserve is selected and provided, or a reserve of the LED dies corresponding to each of the collocation parameters is displayed and provided (step S409).

When the number of the obtained and provided collocation parameter is one (i.e. the determination result of the step S407 is "affirmative"), the obtained single collocation parameter is provided, and a charge-in end is notified to complement the empty or insufficient LED dies (S411).

Similarly, if each of the obtained and provided collocation parameters corresponds to multiple LED bin code areas, the (LED) lamp complied with the predetermined lamp specification can include a plurality of the LED dies with different characteristics (the color temperature and the lumen). In other words, a plurality of the LED dies with different characteristics (i.e. the mix bin method) is used to implement the color temperature and the lumen corresponding to the predetermined lamp specification.

However, if each of the obtained and provided collocation parameters corresponds to a single LED bin code area, the (LED) lamp complied with the predetermined lamp specification only includes a plurality of the LED dies with the same characteristic. In other words, a plurality of the LED dies with the same characteristic (the color temperature and the lumen) is used to implement the color temperature and the lumen corresponding to the predetermined lamp specification.

In summary, by sorting all of the charge-in LED dies, the LED dies with the same characteristic are disposed in the corresponding LED bin code area, and the collocation lookup table recording a plurality of collocation parameters corresponding to a same lamp specification is established, where each collocation parameter corresponds to at least one (i.e. one or more than one) LED bin code area. Accordingly, even though the LED dies corresponding to a certain predetermined lamp specification are empty or are insufficient in reserve, in the invention, it is still suggested to use other reserves or non-empty LED dies with different characteristics (i.e. a mix bin method) through the established collocation lookup table for manufacturing an LED lamp of a certain specification, so as to effectively resolve the problem mentioned in the related art.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A selection system, comprising:
   a sorting module, sorting a plurality of charge-in light-emitting diode (LED) dies with different characteristics to dispose the LED dies with the same characteristic in a corresponding LED bin code area, and establishing a sorting table relating to the LED dies; and
   a collocation module, coupled to the sorting module, and inbuilt with a collocation lookup table, wherein the collocation lookup table records a plurality of roots corresponding to different lamp specifications, each of the roots has a plurality of collocation parameters corresponding to the same lamp specification, and each collocation parameter corresponds to at least one LED bin code area,
   wherein the collocation module reads the sorting table to learn the applicable LED dies, and looks up the collocation lookup table in response to an input condition of a predetermined lamp specification, so as to obtain and provide at least one collocation parameter complied with the predetermined lamp specification.

2. The selection system as claimed in claim 1, wherein when a number of the at least one collocation parameter is plural, the collocation module selects and provides a collocation parameter corresponding to the LED dies having a sufficient reserve.

3. The selection system as claimed in claim 1, wherein when a number of the at least one collocation parameter is plural, the collocation module displays and provides a reserve of the LED dies corresponding to each of the collocation parameters.

4. The selection system as claimed in claim 1, wherein when a number of the at least one collocation parameter is one, the collocation module provides the obtained single collocation parameter, and notifies a charge-in end to complement the empty or insufficient LED dies.

5. The selection system as claimed in claim 1, wherein the characteristics of each of the LED dies at least comprise a color temperature and a lumen.

6. The selection system as claimed in claim 5, wherein when the obtained collocation parameter only corresponds to a single LED bin code area, a lamp complied with the predetermined lamp specification comprises a plurality of LED dies with the same characteristic.

7. The selection system as claimed in claim 6, wherein the lamp specification corresponding to each of the collocation parameters is complied with American national standards institute (ANSI) specifications.

8. The selection system as claimed in claim 5, wherein when the obtained collocation parameter corresponds to a plurality of LED bin code areas, a lamp complied with the predetermined lamp specification comprises a plurality of LED dies with different characteristics.

9. The selection system as claimed in claim 1, wherein the lamp specification at least comprises a color temperature and a lumen.

10. A selection method, comprising:
    sorting a plurality of charge-in light-emitting diode (LED) dies with different characteristics to dispose the LED dies with the same characteristic in a corresponding LED bin code area, and accordingly establishing a sorting table relating to the LED dies;
    establishing a collocation lookup table, wherein the collocation lookup table records a plurality of roots corresponding to different lamp specifications, each of the roots has a plurality of collocation parameters corresponding to the same lamp specification, and each collocation parameter corresponds to at least one LED bin code area; and
    reading the sorting table to learn the applicable LED dies, and looking up the collocation lookup table in response to an input condition of a predetermined lamp specification, so as to obtain and provide at least one collocation parameter complied with the predetermined lamp specification.

11. The selection method as claimed in claim 10, wherein when a number of the at least one collocation parameter is plural, a collocation parameter corresponding to the LED dies having a sufficient reserve is selected and provided.

12. The selection method as claimed in claim 10, wherein when a number of the at least one collocation parameter is plural, a reserve of the LED dies corresponding to each of the collocation parameters is displayed and provided.

13. The selection method as claimed in claim 10, wherein when a number of the at least one collocation parameter is one, the obtained single collocation parameter is provided, and a charge-in end is notified to complement the empty or insufficient LED dies.

14. The selection method as claimed in claim 10, wherein the characteristics of each of the LED dies at least comprise a color temperature and a lumen.

15. The selection method as claimed in claim 14, wherein when the obtained collocation parameter only corresponds to a single LED bin code area, a lamp complied with the predetermined lamp specification comprises a plurality of LED dies with the same characteristic.

16. The selection method as claimed in claim 14, wherein when the obtained collocation parameter corresponds to a plurality of LED bin code areas, a lamp complied with the predetermined lamp specification comprises a plurality of LED dies with different characteristics.

17. The selection method as claimed in claim 10, wherein the lamp specification at least comprises a color temperature and a lumen.

18. The selection method as claimed in claim 17, wherein the lamp specification corresponding to each of the collocation parameters is complied with American national standards institute (ANSI) specifications.

* * * * *